US011482399B2

(12) United States Patent
Zhang et al.

(10) Patent No.: US 11,482,399 B2
(45) Date of Patent: Oct. 25, 2022

(54) METHOD AND APPARATUS FOR AN ADVANCED CHARGED CONTROLLER FOR WAFER INSPECTION

(71) Applicant: ASML Netherlands B.V., Veldhoven (NL)

(72) Inventors: Jian Zhang, San Jose, CA (US); Qing Jiu Chen, Beijing (CN); Yixiang Wang, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 207 days.

(21) Appl. No.: 16/652,352

(22) PCT Filed: Sep. 25, 2018

(86) PCT No.: PCT/EP2018/075929
§ 371 (c)(1),
(2) Date: Mar. 30, 2020

(87) PCT Pub. No.: WO2019/063531
PCT Pub. Date: Apr. 4, 2019

(65) Prior Publication Data
US 2020/0273662 A1    Aug. 27, 2020

Related U.S. Application Data

(60) Provisional application No. 62/566,212, filed on Sep. 29, 2017.

(51) Int. Cl.
*H01J 37/22* (2006.01)
*G01N 21/95* (2006.01)
*G01N 21/956* (2006.01)
*G02B 27/09* (2006.01)

(52) U.S. Cl.
CPC ........ *H01J 37/228* (2013.01); *G01N 21/9501* (2013.01); *G01N 21/956* (2013.01);
(Continued)

(58) Field of Classification Search
CPC ............ H01J 37/228; H01J 2237/0047; H01J 2237/0048; H01J 2237/004;
(Continued)

(56) References Cited

U.S. PATENT DOCUMENTS 7,408,971 B2 * 8/2008 Zhang .................. H01S 3/0606
372/100
8,885,037 B2 * 11/2014 Taniguchi ............ G01N 21/956
702/81

(Continued)

FOREIGN PATENT DOCUMENTS

| CN | 102473663 A | 5/2012 |
| CN | 102597745 A | 7/2012 |
| JP | 2014-081227 A | 5/2014 |

OTHER PUBLICATIONS

International Search Report and Written Opinion issued in related PCT International Application No. PCT/EP2018/075929, dated Dec. 14, 2018 (11 pgs.).

(Continued)

*Primary Examiner* — David A Vanore
(74) *Attorney, Agent, or Firm* — Finnegan, Henderson, Farabow, Garrett & Dunner, LLP (57) ABSTRACT

A system and method for advanced charge control of a light beam is provided. The system comprising a laser source comprising a laser diode for emitting a beam and a beam homogenizer to homogenize the emitted beam. The system and methods further comprise a beam shaper configured to shape the emitted beam using an anamorphic prism group and a driver configured to direct the shaped beam to a specified position on a wafer, wherein the laser source, the beam shaper, and the driver are coaxially aligned.

17 Claims, 11 Drawing Sheets

(52) U.S. Cl.
CPC ..... *G02B 27/0916* (2013.01); *G02B 27/0972* (2013.01); *G01N 2021/9511* (2013.01); *H01J 2237/0047* (2013.01); *H01J 2237/0048* (2013.01)

(58) Field of Classification Search
CPC ............. G01N 21/9501; G01N 21/956; G01N 2021/9511; G02B 27/0916; G02B 27/0972
See application file for complete search history.

(56) References Cited

U.S. PATENT DOCUMENTS

| | | |
|---|---|---|
| 2005/0017156 A1 | 1/2005 | Ehrmann et al. |
| 2009/0195775 A1 | 8/2009 | Nakao et al. |
| 2012/0092484 A1* | 4/2012 | Taniguchi .......... G01N 21/9501 348/87 |
| 2016/0189923 A1 | 6/2016 | Juodkazis et al. |
| 2017/0176758 A1 | 6/2017 | Lerner et al. |

OTHER PUBLICATIONS

Notification of Reason(s) for Refusal issued in related Korean Patent Application No. 10-2020-7008911; dated Dec. 15, 2021 (10 pgs.).

First Office Action from the Patent Office of the People's Republic of Chine issued in related Chinese Patent Application No. 2018800635114; dated Mar. 17, 2022 (8 pgs.).

* cited by examiner

METHOD AND APPARATUS FOR AN ADVANCED CHARGED CONTROLLER FOR WAFER INSPECTION

CROSS-REFERENCE TO RELATED APPLICATIONS

This application is a national stage filing under 35 U.S.C. § 371 of International Application No. PCT/EP2018/075929, filed on Sep. 25, 2018, and published as WO 2019/063531 A1, which claims priority of U.S. Provisional Application No. 62/566,212, which was filed on Sep. 29, 2017. The contents of these applications are incorporated herein by reference in their entireties.

TECHNICAL FIELD

The present disclosure generally relates to the field of charged particle beam, and more particularly, to a method and an apparatus for charged particle detection.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at predetermined scan locations of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and/or external structures of the wafer, and thus indicates whether the wafer has defects.

However, typical electron-beam inspection tools can struggle to detect various types of wafer defects, thereby limiting the effectiveness of electron-beam inspection tools. One way to improve defect detection is through activation of the wafer using laser beam illumination. Effective control of the laser beam presents difficulties for this type of illumination. Solutions, like those described herein can improve the control and illumination of wafers during inspection.

SUMMARY

Embodiments of the present disclosure relate to advanced charge controllers for wafer inspection and methods of controlling laser beam illumination. Embodiments consistent with the present disclosure include systems and methods for advanced charge control of a light beam, comprising a beam homogenizer to homogenize the emitted beam, a beam shaper configured to shape the emitted beam using an anamorphic prism group, and a driver configured to direct the shaped beam to a specified position on a wafer, wherein the laser source, the beam shaper, and the driver are coaxially aligned.

Embodiments consistent with the present disclosure further include the system wherein the laser source is a laser diode and wherein the laser source is a collimated laser. Additionally embodiments include an anamorphic prism group comprising a group of two or more prisms. In some embodiments the two or more prisms have the same geometry. In other embodiments the two or more prisms have different embodiments. Embodiments consistent with the present disclosure further include a beam homogenizer that is a spherical aberration based beam homogenizer or a microlens beam homogenizer.

Further embodiments consistent with the present disclosure further shape the beam by modifying the size and aspect ratio of the beam. The present disclosure also includes embodiments where the beam entering and exiting the prism group is coaxially aligned.

Systems and methods consistent with the present disclosure further include a driver comprising one or more wedges or one or more plates for directing the beam. Embodiments consistent with present disclosure include a mirror for reflecting the beam from the driver so that the beam intersects the wafer with a substantially circular cross section. Additionally, the mirror can be angled to cause the reflected beam to intersect with the wafer at approximately a 76° angle.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Embodiments of the present disclosure relate to advanced charge controllers for wafer inspection and methods of controlling laser beam illumination. Embodiments consistent with the present disclosure include systems and methods for advanced charge control of a light beam, comprising a beam homogenizer to homogenize the emitted beam, a beam shaper configured to shape the emitted beam using an anamorphic prism group, and a driver configured to direct the shaped beam to a specified position on a wafer, wherein the laser source, the beam shaper, and the driver are coaxially aligned.

The described embodiments allow for effective illumination of a wafer for inspection. As described herein, embodiments consistent with the present disclosure can include a light source such as a laser emitting diode. Such a laser can have a Gaussian intensity profile, which is not well suited for the intended purpose of illuminating a wafer for inspection. Accordingly, the described embodiments can use various s types of beam homogenizers to process the laser beam and convert the beam into a uniform intensity profile. This processed laser can then be sent through a series of anamorphic prisms that reflect and refract the laser beam in a precise sequence to modify the size and shape of the laser beam. For example, embodiments described herein can use the prism arrangement to shape the beam into an anamorphic aspect ratio while at the same time magnifying the beam. The beam can then be passed to a beam steering system that includes plates or wedges and a mirror that are used to reflect the beam onto a wafer. The wedges or plates can be rotated to displace the path of the beam. Depending on the displacement, the beam will reflect off of the mirror and illuminate a portion of the wafer for inspection. As different areas of the wafer are inspected, the beam steering plates or wedges can move so that the beam spot moves to the appropriate location on the wafer. Additionally, the mirror can be angled to create an optimum Brewster angle that maximizes absorption of the beam by the wafer. Additionally because the mirror reflects the beam at an angle, the aspect ratio of the reflected beam when it intersects the wafer can stretch from the anamorphic aspect ratio created by the prism group into a circular cross section.

Using prisms to shape the beam can minimize the complexity of the overall system by eliminating moving parts and the number of axes or dimensions in which the beam moves or can be adjusted. Prism groups consistent with the present disclosure can alter and shape the beam in a single axis. This can simplify alignment because the movement of the beam only needs to be controlled in a single axis. Moreover, limiting the axes in which the beam moves can simplify manufacturing and minimize the space requirements of the overall embodiments. Additionally, these embodiments can allow the entry and exit of the beam into and out of the prism group, respectively, to be coaxially aligned further simplifying the manufacturing and alignment of other components.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference will now be made in detail to the example embodiments, which are illustrated in the accompanying drawings. Although the following embodiments are described in the context of advanced charge control for wafer inspection, the disclosure is not so limited. Other types of charge control for beams can be similarly applied.

Figure 1:
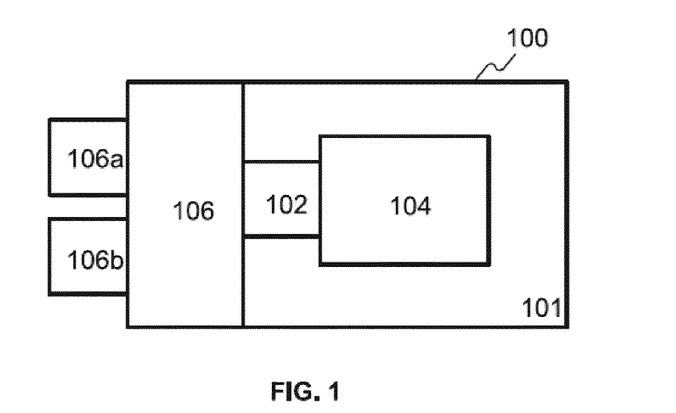
FIG. 1 is a schematic diagram illustrating an exemplary electron beam inspection (EBI) system, consistent with embodiments of the present disclosure.

FIG. 1 illustrates an exemplary electron beam inspection (EBI) system 100 consistent with embodiments of the present disclosure. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer cassettes that contain wafers (e.g., semiconductor wafers or wafers made of other material(s)) or samples to be inspected (wafers and samples are collectively referred to as "wafers" hereafter).

One or more robot arms (not shown) in EFEM 106 transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104.

Figure 2:
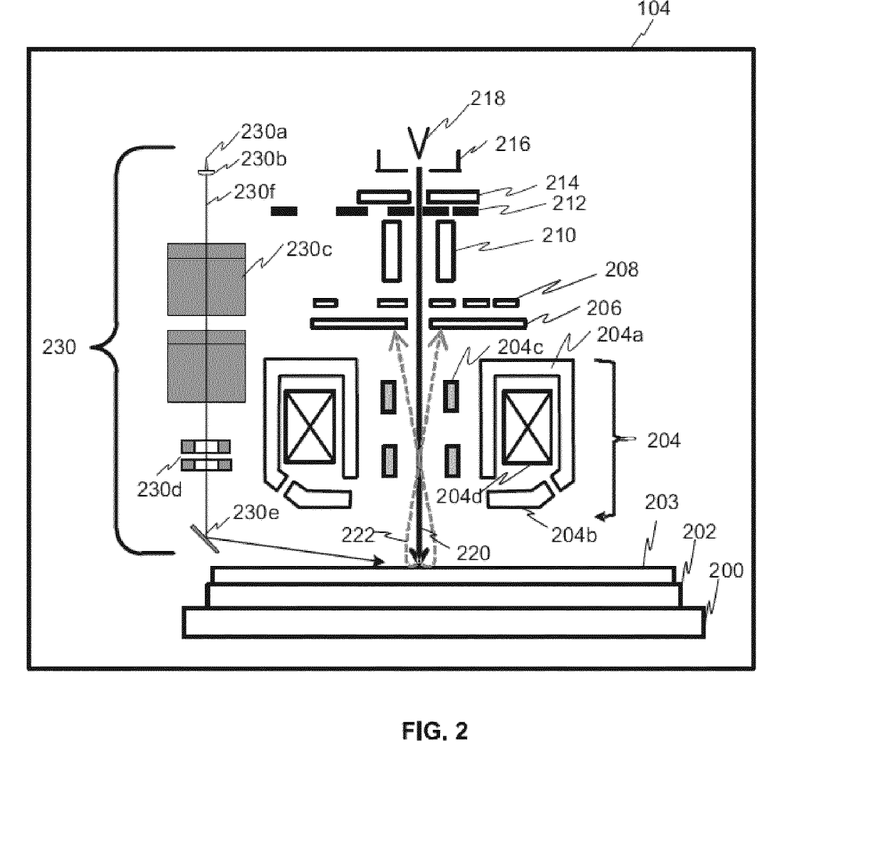
FIG. 2 is a schematic diagram illustrating an exemplary electron beam tool that can be a part of the exemplary electron beam inspection of FIG. 1, consistent with embodiments of the present disclosure.

Reference is now made to FIG. 2, which illustrates exemplary components of electron beam tool 104 consistent with embodiments of the present disclosure. As shown in FIG. 2, electron beam tool 104 includes a motorized stage 200, and a wafer holder 202 supported by motorized stage 200 to hold a wafer 203 to be inspected. Electron beam tool 104 further includes an objective lens assembly 204, electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in one embodiment, can include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which can determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c can be controlled to deflect primary electron beam 220 sequentially onto different locations of top surface of wafer 203 at different time points, to provide data for image reconstruction for different parts of wafer 203. Moreover, deflector 204c can also be controlled to deflect primary electron beam 220 onto different sides of wafer 203 at a particular location, at different time points, to provide data for stereo image reconstruction of the wafer structure at that location. Further, in some embodiments, anode 216 and cathode 218 can be configured to generate multiple primary electron beams 220, and electron beam tool 104 can include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 can be immersed in the magnetic field and can be electrically charged, which, in turn, creates an electric field. The electric field reduces the energy of impinging primary electron beam 220 near the surface of the wafer before it collides with the wafer. Control electrode 204b, being electrically isolated from pole piece 204a, controls an electric field on the wafer to prevent micro-arching of the wafer and to ensure proper beam focus.

A secondary electron beam 222 can be emitted from the part of wafer 203 upon receiving primary electron beam 220. Secondary electron beam 222 can form a beam spot (e.g., one of beam spots 240a and 240b) on sensor surfaces 206a and 206b of electron detector 206. Electron detector 206 can generate a signal (e.g., a voltage, a current, etc.) that represents an intensity of the beam spot, and provide the signal to a processing system (not shown in FIG. 2). The intensity of secondary electron beam 222, and the resultant beam spot, can vary according to the external and/or internal structure of wafer 203. Moreover, as discussed above, primary electron beam 220 can be projected onto different locations of the top surface of the wafer, and/or different sides of the wafer at a particular location, to generate secondary electron beams 222 (and the resultant beam spot) of different intensities. Therefore, by mapping the intensities of the beam spots with the locations of wafer 203, the processing system can reconstruct an image that reflects the internal and/or external structures of wafer 203.

Electron beam tool 104 can further include advanced charge controller 230. Advanced charge controller 230 can include light source 230a, beam homogenizer 230b, light beam 230f, beam shaper 230c, beam steering wedge 230d, and reflection mirror 230e. Each of these features of advanced charge controller 230 is described in more detail below. Advanced charge controller 230 can direct an illumination beam to a spot on wafer 203. Illuminating a spot on a wafer that is under inspection can improve the defect detection of defects on wafer 203.

Figures 3A, 3B:
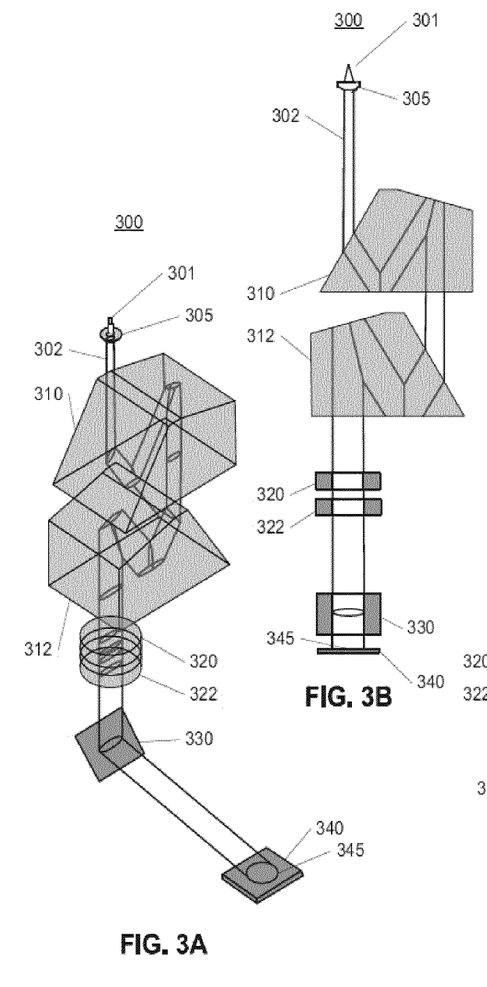
FIGS. 3A-3C are diagrams illustrating exemplary advanced charge controllers for wafer illumination, consistent with embodiments of the present disclosure.
Figure 3C:
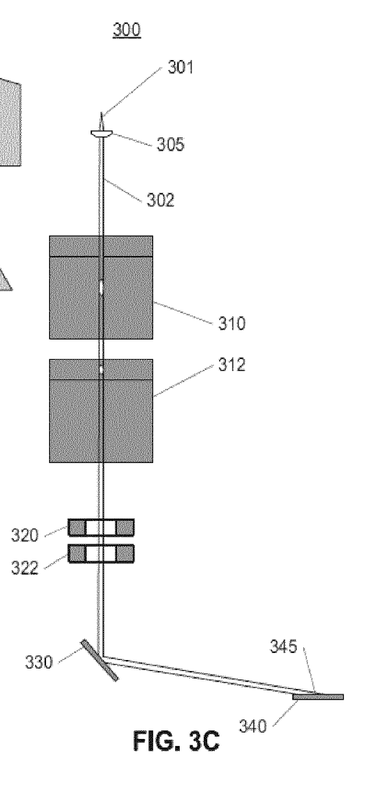

FIGS. 3A-3C are different views of an exemplary advanced charge controller 300 for illuminating a wafer during inspection consistent with embodiments of the present disclosure. FIG. 3A is a perspective view of advanced charge controller 300. FIG. 3B is a side view of advanced charge controller 300. FIG. 3C is a front view of advanced charge controller 300.

Advanced charge controller 300 can include a light source 301. In some embodiments, light source 301 can be a laser diode. In other embodiments, light source 301 can be any type of laser or fiber illumination. Light source 301 can emit a beam 302 of light for advanced charge controller 300. Beam 302 can be a Gaussian beam.

Different light sources can also produce beam 302 with differing shapes. In some embodiments, light source 301 can be a laser diode that produces Gaussian beam 302 with a 3:2 aspect ratio. This type of beam would have a profile similar to that shown in FIGS. 5A-5D, described in more detail below.

After light source 301 emits beam 302, beam 302 can pass through beam homogenizer 305. Beam homogenizer 305 can convert the Gaussian intensity profile of beam 302 into a uniform intensity profile as shown in FIGS. 5A-5D, described in more detail below.

In some embodiments, beam homogenizer 305 can be a microlens-based beam homogenizer. A microlens-based beam homogenizer can use microlens arrays, such as those produced by Edmund Optics or Linos, to divide the Gaussian beam 302 into multiple beams. These beams can then pass through an additional microlens and spherical lens to combine the multiple beams into a single beam 302 with uniform intensity profile.

In some embodiments, beam homogenizer 305 can be a spherical aberration based beam homogenizer. A spherical aberration based beam homogenizer can use multiple aspheric lenses facing each other to convert a Gaussian input beam into a uniform output profile. As the Gaussian beam enters the first aspheric lens, the diverging portions of the beam are redirected to the second aspheric lens that normalizes the beam path into beam 302 having a uniform intensity profile. The An example of these profile differences are shown in FIGS. 5A-5D.

Figure 5A:
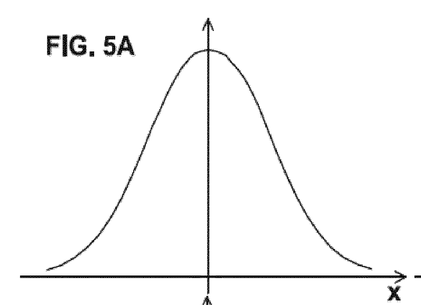
FIGS. 5A-5D are exemplary beam profiles consistent with embodiments of the present disclosure.
Figure 5B:
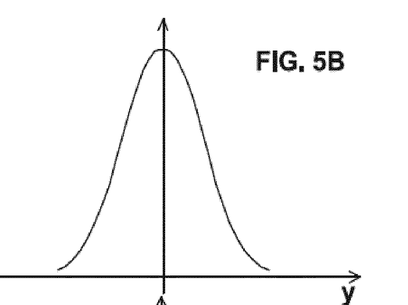

FIGS. 5A-5D show various profiles of beam 302 before and after beam 302 passes through beam homogenizer 305. FIG. 5A is a perpendicular beam profile for beam 302 and FIG. 5B is a parallel beam profile for beam 302. The sloping profile of beam 302 shown in FIGS. 5A-5B represents the divergence or falloff in intensity from the center of Gaussian beam 302 as it is emitted from light source 301. This is the result of rays of beam 302 not being perfectly parallel as they are emitted from light source 301. The perpendicular profile (e.g., as shown in FIG. 5A) and parallel profile (e.g., as shown in FIG. 5B) of Gaussian beam 302 can have different divergence amounts. For example, the perpendicular profile of beam 302 can have a divergence of 16° while the parallel profile can have a divergence of 10°. This difference in divergence can be indicative of the elliptical cross section of the beam as it is emitted by light source 301.

Figure 5C:
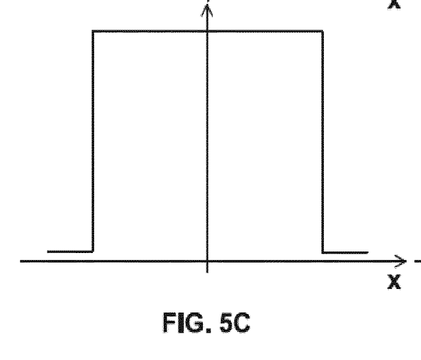
Figure 5D:
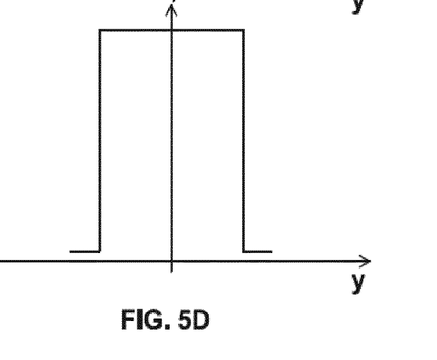

Beam homogenizer 305 converts the Gaussian profiles shown in FIGS. 5A-5B to a flat top profile as shown in FIGS. 5C-5D. Similarly to the profiles in FIGS. 5A-5B, the flat top perpendicular profile of beam 302 shown in FIG. 5C can have a different width than the flat top parallel profile of beam 302 shown in FIG. 5D. This difference in width can represent that an anamorphic, Gaussian beam 302 maintains its anamorphic aspect ratio after passing through beam homogenizer 305. The flat top profile of beam 302, shown in FIGS. 5C-5D represent the uniform intensity distribution of beam 302 after passing through beam homogenizer 305.

A uniform intensity of beam 302 can provide better illumination of the wafer from advanced charge controller 300 of FIGS. 3A-3C.

Referring back to FIGS. 3A-3C, beam 302 can exit beam homogenizer 305 and enter a coaxial beam shaper that includes prism 310 and prism 312. Prism 310 and prism 312 can form a prism group used to shape beam 302. Advanced charge controller 300 is not limited to prism 310 and prism 312. Prism 310 and prism 312 are exemplary. Any prism pair or prism group of one or more prisms can be used.

Figure 6A:
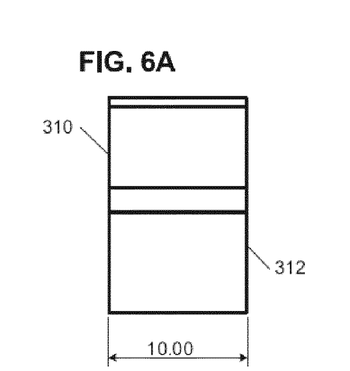
FIGS. 6A-6E are exemplary anamorphic prism pairs, consistent with embodiments of the present disclosure.

Moreover, beam 302 input to prism 310 can be coaxially aligned with the exit of beam 302 from prism 312. As shown in FIGS. 3B-3C, beam 302 enters the prism group and exits the prism group in the same plane. The geometry of prism 310 and prism 312 is described in more detail below in reference to FIG. 6. In some embodiments prism 310 and prism 312 can be the same geometry.

As beam 302 moves through prism 310 and prism 312, prism 310 and prism 312 can reflect and refract beam 302 to enlarge beam 302 and/or modify the shape of beam 302. In some embodiments, prism 310 and prism 312 can shape beam 302 into an anamorphic shape having an oval cross section instead of a circular cross section. The amount of refraction can depend on the refraction index of the prism. For example, the prism 310 and prism 312 can have a refraction index of 1.785.

Figure 6B:
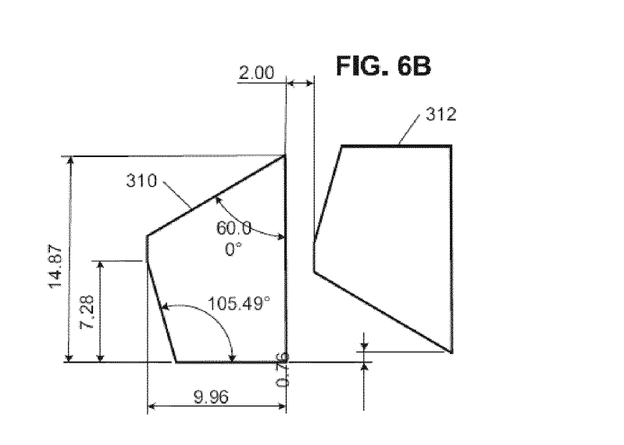

FIGS. 6A-6E are exemplary prism groups including anamorphic prisms, consistent with embodiments of the present disclosure. FIGS. 6A-6E can represent a prism group containing prisms 310 and 312. FIG. 6A can represent a top down view of prism 310 and prism 312. FIG. 6B can represent a side view of the arrangement of prism 310 and prism 312. Prism 310 and prism 312 can be the same prism shape in different orientations. FIGS. 6A-6B represent exemplary measurements for prism 310 and 312 and exemplary measurements for the arrangement of prisms 310 and 312 in a manner consistent with embodiments of the present disclosure. Based on the arrangement and geometry of prism 310 and 312 as shown in FIGS. 6A-6B, prism 310 and prism 312 can, for example, have a refraction index 1.785 and result in a magnification of beam 302 by a factor of 3.06. Additionally, the refraction and reflection can result in beam 302 having an aspect ratio 4:1. By modifying the beam geometry and refraction index of prism 310 and prism 312, different aspect rations and magnification amounts can be achieved. The amount of change in the beam is dependent on many factors including the incidence angle between the beam as it intersects with different surfaces of the prism.

Figure 6C:
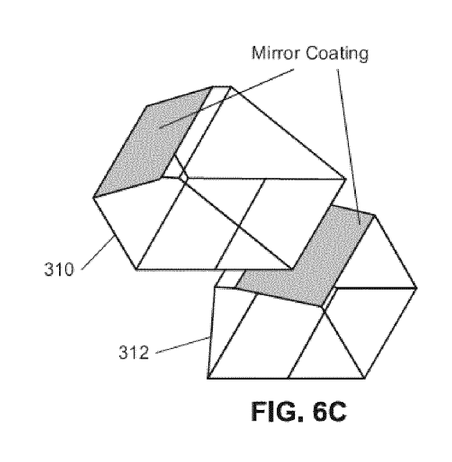
Figure 6D:
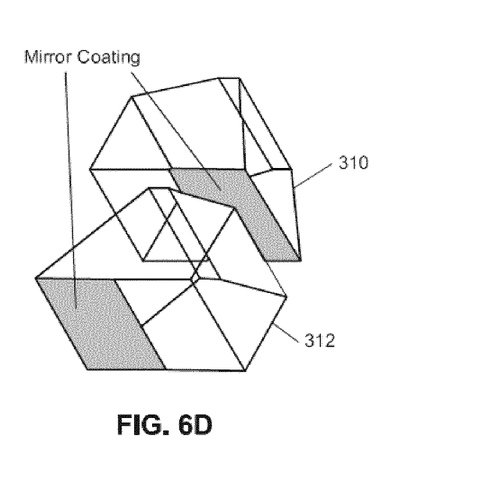

FIGS. 6C-6D are additional views of an exemplary anamorphic prism group containing prism 310 and prism 312. Prism 310 and prism 312 can further include mirror or reflective coating on some of the surfaces of each prism respectively. In some embodiments prism 310 and prism 312 can have the same geometry and have the same mirror coating locations. The reflective coating can reflect beam 302 instead of allowing beam 302 to exit or enter the prism. By aligning the prisms and mirror coatings in a particular way, (e.g., as shown in FIGS. 6A-6D) the prism group that includes prism 310 and prism 312 can shape beam 302 as it moves through the prism group to, for example, enlarge the beam cross section while maintaining coaxial alignment of the entry and exit of beam 302 into and out of prism 310 and prism 312 respectively. FIGS. 6A-6D and prism 310 and prism 312 are exemplary. Different prism geometries can be used to achieve the same modification of beam 302 while also maintaining a coaxial alignment. Moreover different prism geometries or materials can result in different magnification and aspect ratios for beam 302 to optimize the beam for different applications.

Figure 6E:
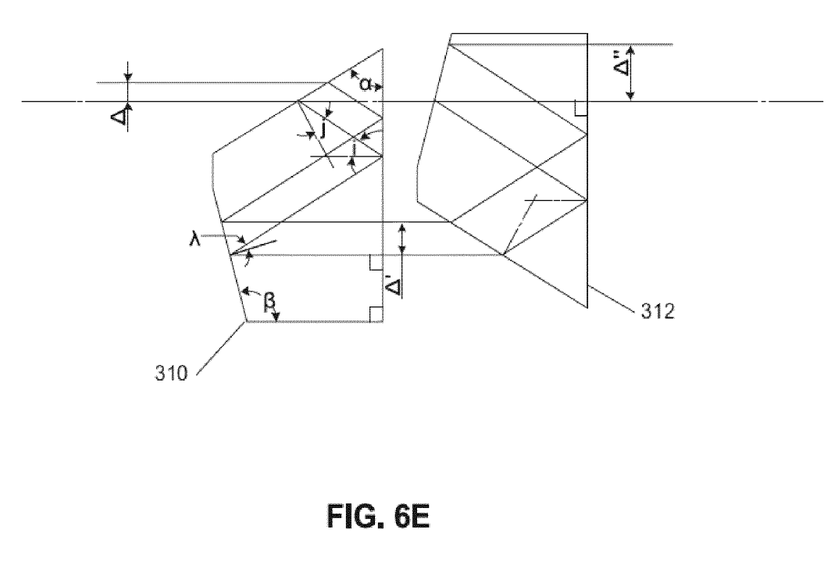

FIG. 6E is an additional view of an exemplary anamorphic prism group containing prism 310 and prism 312. FIG. 6E can represent the path of a beam through prisms 310 and 312. Additionally, FIG. 6E can show the magnification that occurs for a beam of width $\delta$ that is magnified to a width of $\delta''$ after passing through prisms 310 and 312. Additionally, FIG. 6E can show the relevant attributes of prism 310 and 312 that are used to calculate the magnification of the beam as it passes through prisms 310 and 312. For example, the magnification of the beam can be calculated using the following set of mathematical relationships:

$$i + j = \alpha$$
$$\sin\alpha = n\sin j$$
$$90 + \lambda = \beta$$
$$2\lambda = i$$
$$j = \arcsin\left[\frac{\sin\alpha}{n}\right]$$
$$i = \alpha - \arcsin\left[\frac{\sin\alpha}{n}\right]$$
$$\lambda = \frac{i}{2}$$
$$\beta = 90 + \frac{i}{2}$$
$$\delta'' = \delta * \frac{\sin^2(90 - j)}{\cos^2(\alpha)}$$

Using the measured angles in prism 310 and 312, as shown, for example, in FIGS. 6A-6D and FIG. 6E, the magnification of the beam caused by prisms 310 and 312 can be calculated using the above mathematical relationships.

Referring back to FIGS. 3A-3C, after beam 302 exist prism 312, beam 302 can pass through steering wedges 320 and 322. Steering wedge 320 and 322 can be plates of transparent material that can move independently. In some embodiments, steering wedges 320 and 322 can be plane parallel plates that use the refractive index of the plates to displace the location of beam 302. In other embodiments, beam steering can be accomplished using different steering mechanisms such as beam displacement optics or round wedge prisms. Using plane parallel plates can allow for displacement of beam 302 as described in reference to FIG. 8, described in more detail below. By displacing the location of beam 302, steering wedges 320 and 322 can change the location of beam 302. By rotating steering wedges 320 and 322, advanced charge controller 300, can move the displacement of beam 302 and target specific portions of wafer 340 for illumination (described in more detail below).

Additionally, beam steering wedges 320 and 322 can be configured to rotate in only one axis. This can reduce the complexity of steering wedges 320 and 322 while still allowing for effective positioning of the beam 302.

Figure 8:
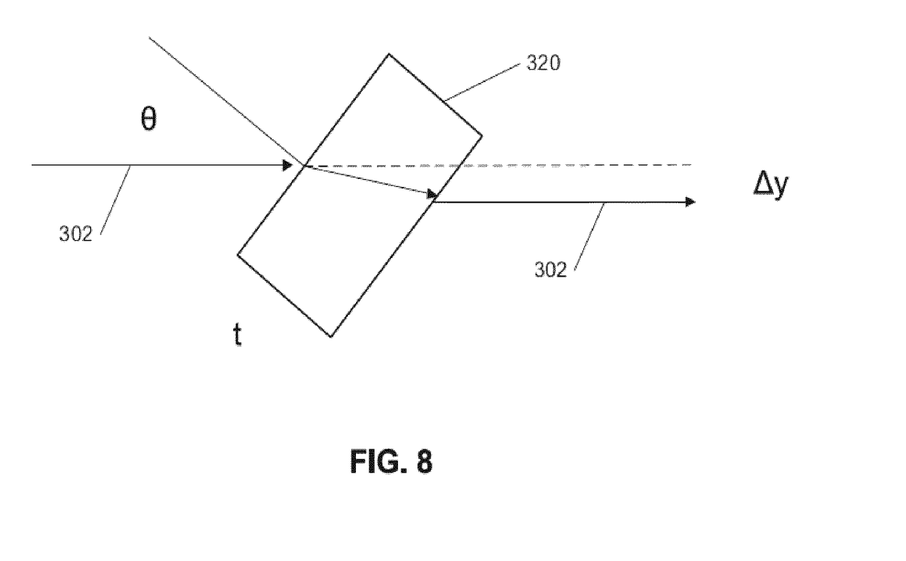
FIG. 8 is a steering wedge, consistent with embodiments of the present disclosure.

FIG. 8 is an exemplary steering wedge 320, consistent with embodiments of the present disclosure. It is appreciated that steering wedge, as shown in FIG. 8, can be the same as steering wedge 320. As shown in FIG. 8, beam 302 can enter steering wedge 320 at angle $\Theta$ and exit steering wedge 320 with a displacement of $\Delta y$. The displacement, $\Delta y$ can be calculated using the formula $$\Delta y = \frac{\Theta_f(n-1)}{n}$$

where $\Theta_f$ angle of steering wedge 320 and n is the refractive index of the glass plate. Using this formula, advanced charge controller 300 can calculate the displacement of beam 302 as it passes through steering wedge 320.

Referring back to FIGS. 3A-C, beam 302 can exit steering wedge 322 and intersect with reflecting mirror 330. Reflecting mirror 330 can reflect beam 302 to wafer 340. Beam 302 can intersect wafer 340 at point 345. As steering wedge 320 and 322 are moved, the displacement of beam 302 changes affecting the location of point 345 on wafer 340. Reflecting mirror 330 can be oriented to reflect beam 302 so that beam 302 intersects wafer 340 at point 345 at a Brewster angle of approximately 76°. At a Brewster angle of approximately 76°, the maximum absorption of the light can be achieved allowing for optimal illumination of wafer 340. It is appreciated that, although achieving the Brewster angle is optimal, in some embodiments, an angle in the range of approximately 66° to 86° is effective for providing illumination of a wafer during inspection.

Additionally, the shape of beam 302 from prism 312 can be shaped at an appropriate aspect ratio so that the reflection off of mirror 330 can result in a cylindrical point 345. For example, mirror 330 can be arranged to result in a magnification factor of approximately 4. In this example, an input beam 302 having a 4:1 aspect ratio will result in a reflection off of mirror 330 and, based on the magnification factor, result in a circular point 345 on wafer 340. If an elliptical point 345 is desired, prism 310 and prism 312 can be adjusted so that the shape of beam 302 results in an elliptical aspect ratio after beam 302 reflects from mirror 330.

Figures 4A, 4B:
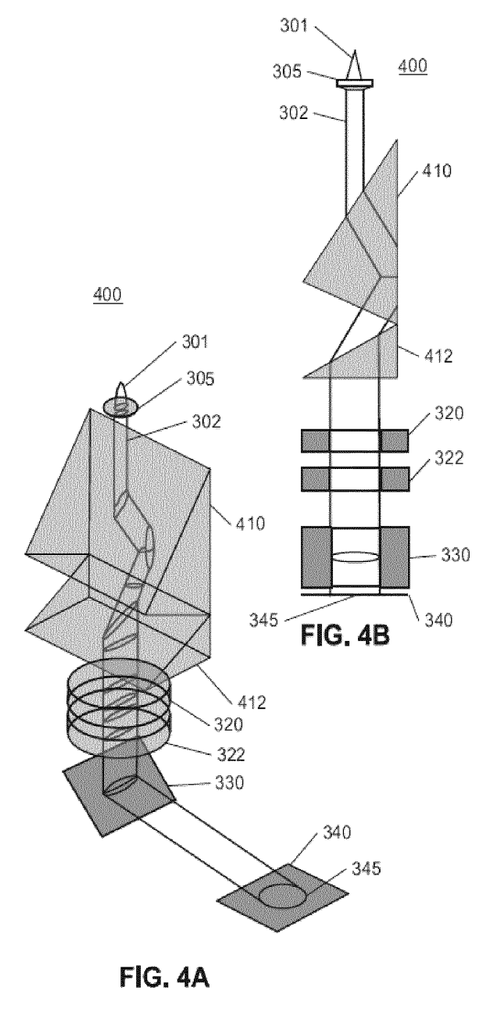
FIGS. 4A-4C are diagrams illustrating exemplary advanced charge controllers for wafer illumination consistent with embodiments of the present disclosure.
Figure 4C:
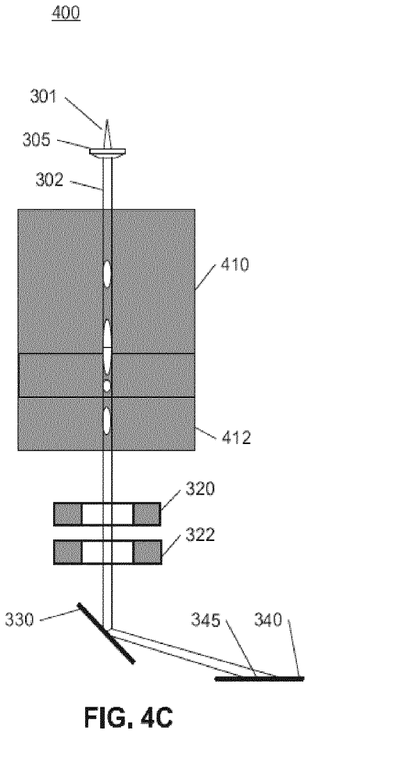

FIGS. 4A-4C are different views of an exemplary advanced charge controller 400 for illuminating a wafer during inspection consistent with embodiments of the present disclosure.

Advanced charge controller 400 in FIGS. 4A-4C includes light source 301, beam 302, beam homogenizer 305, steering wedge 320, steering wedge 322, mirror 330, wafer 340, and point 345. Each of these components can be identical to the components described above in relation to advance charge controller 300 shown in FIGS. 3A-3C. These components can have the same specifications, descriptions, and functionality as described in relation to FIGS. 3A-3C. Advance charge controller 400 can have different prisms in its prism group than advance charge controller 300. This can allow advance charge controller 400 to produce different shaping of beam 302 from advance charge controller 300. Accordingly, advance charge controller 400 can be an example of changing the prism group to achieve different beam shaping results. Accordingly, changing the prism group can allow advance charge controller 300 and advance charge controller 400 to be adapted to different applications or configurations.

Advanced charge controller 400 can include prism 410 and prism 412. Unlike prism 310 and prism 312 in advance charge controller 300, prism 410 and prism 412 can be different shapes. Similar to advance charge controller 300, prism 410 and prism 412 can enlarge beam 302 and modify the shape of beam 302 while maintaining coaxial alignment of beam 302.

Additionally, advanced charge controller 400 is not limited to prism 410 and prism 412. Prism 410 and prism 412 are exemplary. Any prism pair or prism group of one or more prisms can be used to achieve a similar result.

Moreover, beam 302 input to prism 410 can be coaxially aligned with the exit of beam 302 from prism 412. As shown in FIGS. 4B-4C, beam 302 enters the prism group and exits the prism group in the same plane. The geometry of prism 410 and prism 412 is described in more detail below in reference to FIGS. 7A-C. In some embodiments prism 410 and prism 412 can be different geometry. Having differing geometry can simplify the arrangement of prism 410 and prism 412 but can increase manufacturing requirements. By utilizing different geometries, prism 410 and prism 412 can achieve the required beam shape but also allow for advance charge controller 400 to meet different constraints, such as physical space limitations within electron beam tool 104 of FIG. 1.

As beam 302 moves through prism 410 and prism 412, prism 410 and prism 412 can reflect and refract beam 302 to enlarge beam 302 and/or modify the shape of beam 302. In some embodiments prism 410 and prism 412 can shape beam 302 into an anamorphic shape having an elliptical cross section. The amount and sequence of reflections and refractions applied to beam 302 can control the particular resulting aspect ratio and magnification that is produced by prism 410 and prism 412.

Figure 7A:
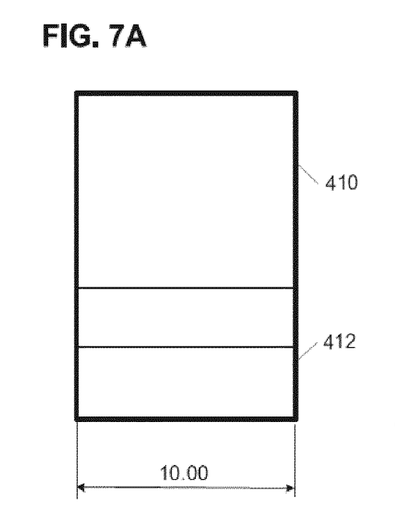
FIGS. 7A-7D are exemplary anamorphic prism pairs, consistent with embodiments of the present disclosure.
Figure 7B:
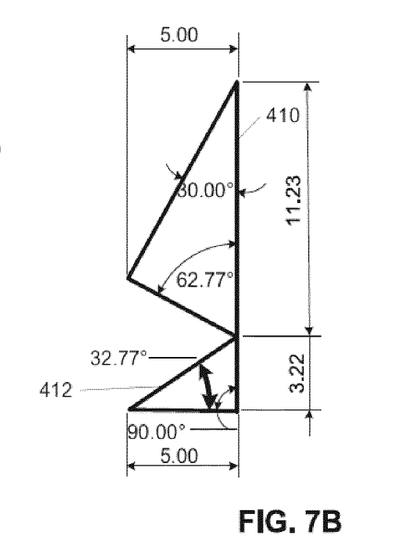
Figure 7C:
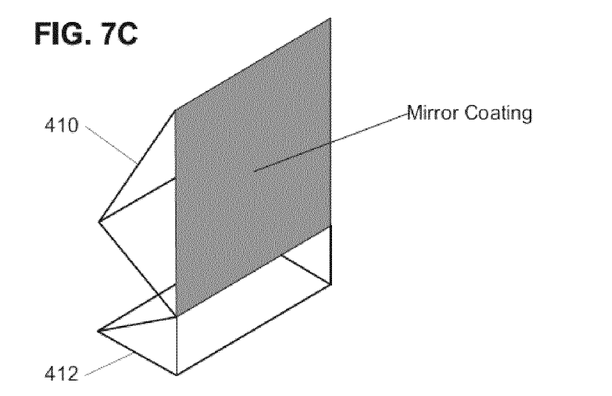

FIGS. 7A-7D are exemplary anamorphic prisms, consistent with embodiments of the present disclosure. FIGS. 7A-7D can represent a prism group containing prisms 410 and 412. FIG. 7A can represent a top down view of prism 410 and prism 412 and their arrangement. FIG. 7B can represent a side view of prism 410 and prism 412 and their arrangement. Prism 410 and prism 412 can be different prism shapes as depicted in FIGS. 7A-7C. FIGS. 7A-7C represent exemplary measurements for prism 410 and 412 and exemplary measurements for the arrangement of prisms 410 and 412 in a manner consistent with embodiments of the present disclosure. Based on the arrangement and geometry of prism 410 and 412 as shown in FIGS. 7A-7B, prism 410 and prism 412 can, for example, have a refraction index 1.60 and result in a magnification of beam 302 by a factor of 2.83. Additionally, the refraction and reflection can result in beam 302 having an aspect ratio of 4:1.

FIG. 7C is an additional view of an exemplary anamorphic prism group containing prism 410 and prism 412. Prism 410 and prism 412 can further include mirror or reflective coating on some of the surfaces of one of the prisms or both prisms. The reflective coating can reflect beam 302 back inside a prism instead of allowing beam 302 to exit the prism. By aligning the prisms and mirror coatings in a particular way, (e.g., as shown in FIGS. 7A-7C) the prism group that includes prism 410 and prism 412 can shape beam 302 as it moves through the prism group to, for example, enlarge the beam cross section while maintaining coaxial alignment of the entry and exit of beam 302 into and out of prism 410 and prism 412 respectively. FIGS. 7A-7C and prism 410 and prism 412 are exemplary. Different prism geometries can be used to achieve the same modification of beam 302 in a coaxial alignment.

Figure 7D:
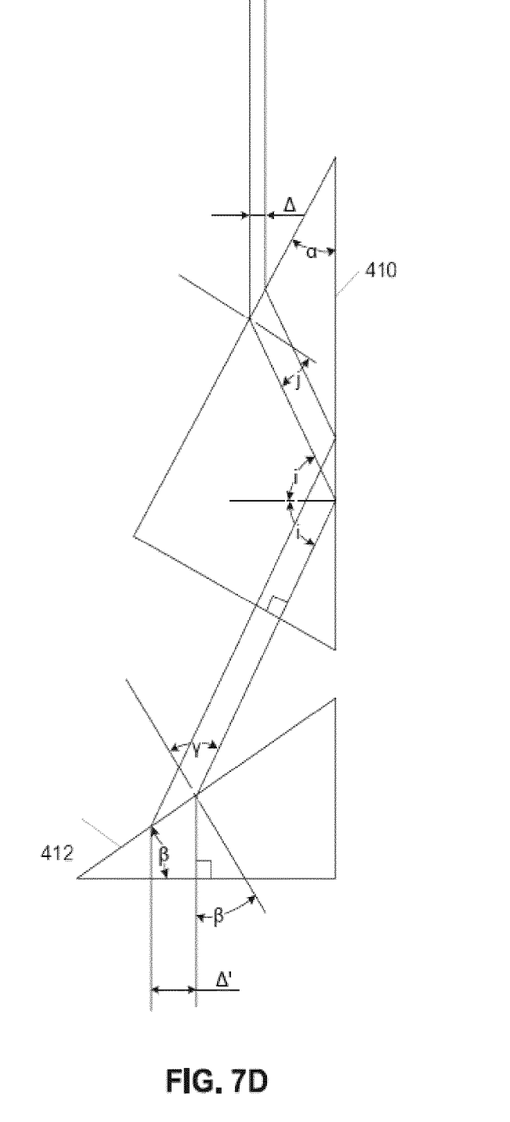

FIG. 7D is an additional view of an exemplary anamorphic prism group containing prism 410 and prism 412.

FIG. 7D can represent the path of a beam through prisms 410 and 412. Additionally, FIG. 7D can show the magnification that occurs for a beam of width δ that is magnified to a width of δ' after passing through prisms 410 and 412. Additionally, FIG. 7D can show the relevant attributes of prism 410 and 412 that are used to calculate the magnification of the beam as it passes through prisms 410 and 412.

For example, the magnification of the beam can be calculated using the following set of mathematical relationships:

$$i = \alpha + j$$
$$\sin(90 - \alpha) = n\sin j$$
$$90 - \gamma + \beta = i$$
$$\sin(\gamma) = n\sin\beta$$
$$j = \arcsin\left[\frac{\sin(90 - \alpha)}{n}\right]$$
$$i = \arcsin\left[\frac{\sin(90 - \alpha)}{n}\right] + \alpha$$
$$\beta = \arctan\left(\frac{\cos i}{n - \sin i}\right)$$
$$\delta' = \delta * \frac{\frac{\cos\beta * \sin(90 - j)}{\sin\alpha}}{\sin(i - \beta)}$$

Using the measured angles in prism 410 and 412, as shown, for example, in FIGS. 7A-7C and FIG. 7D, the magnification of the beam caused by prisms 410 and 412 can be calculated using the above mathematical relationships.

Figure 9:
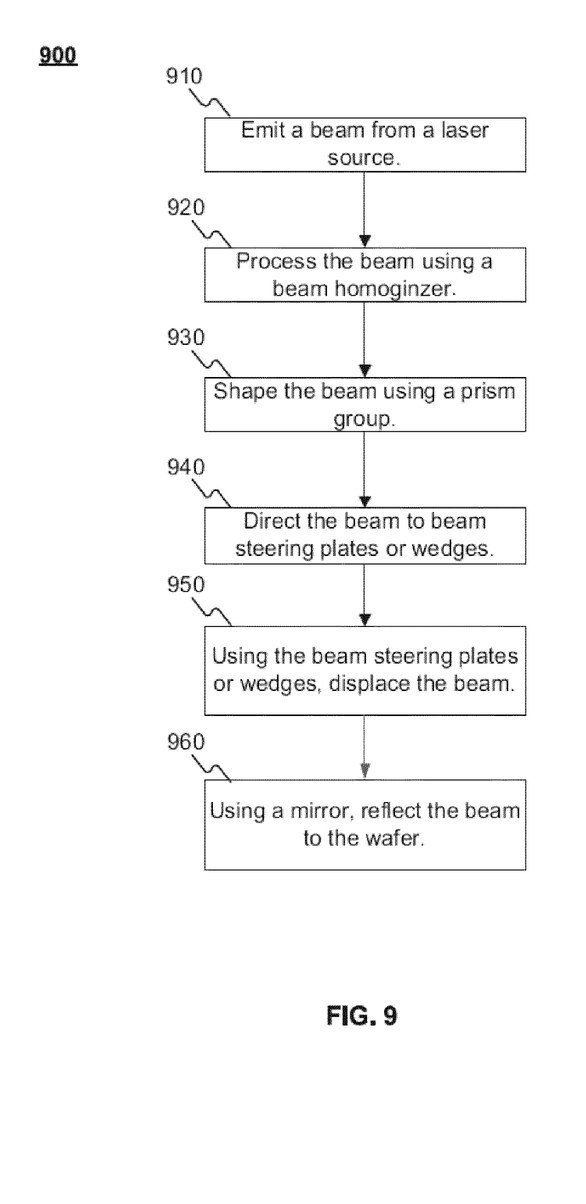
FIG. 9 is a flowchart illustrating an exemplary method for controlling an illumination beam, consistent with embodiments of the present disclosure.

FIG. 9 is a flowchart illustrating an exemplary method 900 for advanced charge control of an illumination beam, consistent with embodiments of the present disclosure. It will be readily appreciated that the illustrated procedure can be altered to delete steps or further include additional steps. Method 900 can be performed by, for example, electron beam tool 104 of FIG. 1 in conjunction with the system for advanced charge control (e.g., advance charge controller 300 or 400 of FIGS. 3A-3C or 4A-4C).

Method 900 begins by emitting (step 910) a beam from a light source (e.g., from light source 301 of FIGS. 3A-3C and 4A-4C). In some embodiments the light source (e.g. light source 301) can be a laser diode, another type of laser, or a fiber illumination. The light source can emit a Gaussian beam (e.g., beam 302)

The system can process (step 920) the beam using a beam homogenizer (e.g., beam homogenizer 305 of FIGS. 3A-3C or FIGS. 4A-4C). The system can process the beam to eliminate non-uniform Gaussian intensity by using, for example, a microlens-based beam homogenizer or a spherical aberration based beam homogenizer. Processing the beam using a beam homogenizer can convert the Gaussian beam into a flat top profile.

After processing the beam, the system can shape (step 930) the beam using a prism group (e.g., prism 310 and prism 312 of FIGS. 3A-3C and 6A-6D, or prism 410 and prism 412 of FIGS. 4A-4C and 7A-7C). Shaping the beam can result in an anamorphic beam shape and an enlarged beam profile. The prisms used for shaping can be arranged such that the entry and exit points of the beam into the prism group are coaxially aligned.

After shaping the beam, the system can direct (step 940) the beam to beam steering plates or wedges (e.g., beam steering wedge 320 and 322 of FIGS. 3A-3C and FIGS. 4A-4C). Using the beam steering plates, the system can displace (step 950) the beam. The displacement of the beam can be calculated using the formula, $$\Delta y = \frac{\Theta_t(n - 1)}{n}$$

where $\Theta_t$ is the tilting angle of a steering wedge, n is the refractive index of the steering wedge, and $\Delta y$ is the displacement of the beam.

After displacing the beam, the system can reflect (step 960) the beam to the wafer (e.g., using mirror 330 of FIGS. 3A-3C and FIGS. 4A-4C). The angle of reflection can be configured to cause the beam to intersect the wafer at a Brewster angle of approximately 76° to optimize absorption of the beam. As discussed above, in some embodiments, an angle in the range of approximately 66° to 86° can also provide effective illumination of the wafer. Additionally, the reflection of the mirror can cause the anamorphic beam to intersect the wafer with circular or elliptical cross section.

The embodiments may further be described using the following clauses:

1. A system for advanced charge control of a light beam, the system comprising:
    a laser source for emitting a beam;
    a beam homogenizer to homogenize the emitted beam;
    a beam shaper configured to shape the emitted beam using an anamorphic prism group; and
    a driver configured to direct the shaped beam to a specified position on a wafer,
    wherein the laser source, the beam shaper, and the driver are coaxially aligned.
2. The system of clause 1, wherein the laser source is a laser diode.
3. The system of clause 1, wherein the laser source is a collimated laser.
4. The system of any one of clauses 1 through 3, wherein the anamorphic prism group comprises a group of two or more prisms.
5. The system of clause 4, wherein the two or more prisms have the same geometry.
6. The system of any one of clauses 1 through 5, wherein the anamorphic prism group shapes the beam, wherein shaping the beam comprises modifying the size and aspect ratio of the beam.
7. The system of any one of clauses 1 through 6, wherein the anamorphic prism group produces an output beam that is coaxially aligned with an input beam.
8. The system of any one of clauses 1 through 7, wherein the driver comprises one or more wedges for directing the beam.
9. The system of any one of clauses 1 through 7, wherein the driver comprises one or more plates for directing the beam.
10. The system of any one of clauses 1 through 9, wherein the driver comprises a mirror for reflecting the beam to the wafer, wherein the mirror is positioned at an angle to modify the beam so that the beam intersects the wafer with a substantially circular cross section.
11. The system of clause 10, wherein the mirror is further positioned to cause the beam to intersect the wafer at a an angle between 66° and 86°.
12. The system of any one of clauses 1 through 11 wherein the beam homogenizer is a spherical aberration homogenizer.
13. A method for controlling a light beam spot, the method comprising:
    emitting a beam from a laser source;
    homogenizing the emitted beam using a beam homogenizer;
    shaping the emitted beam using an anamorphic prism group;
    directing the shaped beam to a specified position on a wafer.

14. The method of clause 13, wherein shaping the emitted beam using the anamorphic prism group comprises passing the emitted beam through two or more prisms.

15. The method of any one of clauses 13 through 14, wherein shaping the emitted beam using the anamorphic prism group further comprises passing the emitted beam through two or more prisms having the same geometry.

16. The method of clause 15, wherein passing the emitted beam through two or more prisms further comprises an output beam from the two or more prisms that is coaxially aligned with an input beam to the two or more prisms.

17. The method of any one of clauses 13 through 16 wherein shaping the beam comprises modifying the size and aspect ratio of the beam.

18. The method of any one of clauses 13 through 17, wherein directing the emitted beam further comprises directing the emitted beam with one or more wedges.

19. The method of any one of clauses 13 through 18, wherein directing the emitted beam further comprises:
directing the emitted beam with a mirror for reflecting the beam to the wafer; and
positioning the mirror at an angle to shape the beam so that the beam intersects the wafer with a substantially circular cross section.

20. The method of clause 19, wherein positioning the mirror comprises positioning the mirror at an angle for causing the beam to intersect the wafer at 76°.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A system for advanced charge control of a light beam, the system comprising:
   a laser source for emitting a beam;
   a beam homogenizer to homogenize the emitted beam;
   a beam shaper configured to shape the emitted beam using an anamorphic prism group,
   wherein the anamorphic prism group comprises a group of two or more prisms, the group of two or more prisms being coaxially aligned so that the beam entering the group of two or more prisms and exiting the group of two or more prisms is coaxially aligned; and
   a driver configured to direct the shaped beam to a specified position on a wafer, wherein the laser source, the beam shaper, and the driver are coaxially aligned.

2. The system of claim 1, wherein the laser source is a laser diode.

3. The system of claim 1, wherein the laser source is a collimated laser.

4. The system of claim 1, wherein the two or more prisms have the same geometry.

5. The system of claim 1, wherein the anamorphic prism group shapes the beam, wherein shaping the beam comprises modifying the size and aspect ratio of the beam.

6. The system of claim 1, wherein the anamorphic prism group produces an output beam that is coaxially aligned with an input beam.

7. The system of claim 1, wherein the driver comprises one or more wedges for directing the beam.

8. The system of claim 1, wherein the driver comprises one or more plates for directing the beam.

9. The system of claim 1, wherein the driver comprises a mirror for reflecting the beam to the wafer, wherein the mirror is positioned at an angle to modify the beam so that the beam intersects the wafer with a substantially circular cross section.

10. The system of claim 9, wherein the mirror is further positioned to cause the beam to intersect the wafer at an angle between 66° and 86°.

11. The system of claim 1, wherein the beam homogenizer is a spherical aberration homogenizer.

12. The system of claim 1, wherein the system comprises an advanced charge controller.

13. The system of claim 12, further comprising:
    a charged particle beam apparatus configured to expose the wafer surface with a charged particle beam,
    wherein the advanced charge controller is configured to regulate charge on the sample surface.

14. A method for controlling a light beam spot, the method comprising:
    emitting a beam from a laser source;
    homogenizing the emitted beam using a beam homogenizer;
    shaping the emitted beam using an anamorphic prism group,
    wherein shaping the emitted beam using the anamorphic prism group further comprises passing the emitted beam through two or more prisms, wherein the beam entering and exiting the prism group is coaxially aligned; and
    directing the shaped beam to a specified position on a wafer.

15. The method of claim 14, wherein shaping the emitted beam using the anamorphic prism group further comprises passing the emitted beam through two or more prisms having the same geometry.

16. The method of claim 14, further comprising:
    controlling charge on the wafer surface by the shaped beam.

17. The method of claim 16, wherein the controlling charge on the wafer surface takes place during a charged particle beam process on the wafer.

* * * * *